(12) United States Patent
Ramakrishnan et al.

(10) Patent No.: US 11,486,980 B2
(45) Date of Patent: Nov. 1, 2022

(54) LIDAR RECEIVER WITH DUAL ANALOG-TO-DIGITAL CONVERTERS

(71) Applicant: Lumentum Operations LLC, Milpitas, CA (US)

(72) Inventors: Srikanth Ramakrishnan, Ottawa (CA); Barrie P. Keyworth, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 429 days.

(21) Appl. No.: 16/673,197

(22) Filed: Nov. 4, 2019

(65) Prior Publication Data

US 2021/0063550 A1    Mar. 4, 2021

Related U.S. Application Data

(60) Provisional application No. 62/895,813, filed on Sep. 4, 2019.

(51) Int. Cl.
| | |
|---|---|
| *G01C 3/08* | (2006.01) |
| *G01S 7/4863* | (2020.01) |
| *G01S 7/484* | (2006.01) |
| *G01S 7/4913* | (2020.01) |
| *G01S 7/493* | (2006.01) |
| *H03M 1/12* | (2006.01) |

(52) U.S. Cl.
CPC ............ *G01S 7/4863* (2013.01); *G01S 7/484* (2013.01); *G01S 7/493* (2013.01); *G01S 7/4913* (2013.01); *H03M 1/126* (2013.01)

(58) Field of Classification Search
None
See application file for complete search history.

(56) References Cited

U.S. PATENT DOCUMENTS

2020/0278432 A1* 9/2020 Thorpe .................. G01S 7/4915

FOREIGN PATENT DOCUMENTS

CN    110244821 B  *  7/2021

\* cited by examiner

*Primary Examiner* — Mark Hellner
(74) *Attorney, Agent, or Firm* — Harrity & Harrity, LLP

(57) ABSTRACT

A light detection and ranging (lidar) receiver may include a first frequency filter to pass a first range of frequencies of an analog signal. The lidar receiver may include a second frequency filter to pass a second range of frequencies of the analog signal that is different from the first range of frequencies of the analog signal. The lidar receiver may include a first analog-to-digital converter (ADC) to derive a first digital signal based on the first range of frequencies of the analog signal using a first sampling rate. The lidar receiver may include a second ADC to derive a second digital signal based on the second range of frequencies of the analog signal using a second sampling rate that is different from the first sampling rate.

20 Claims, 3 Drawing Sheets

LIDAR RECEIVER WITH DUAL ANALOG-TO-DIGITAL CONVERTERS

RELATED APPLICATION

This application claims priority to U.S. Provisional Patent Application No. 62/895,813, filed on Sep. 4, 2019 and entitled "ACTIVE BALANCING FOR IMPROVED COMMON MODE REJECTION IN COHERENT RECEIVERS USING AVALANCHE PHOTODETECTOR AND LIDAR WITH SLOW AND FAST ANALOG-TO-DIGITAL CONVERTERS," the content of which is incorporated by reference herein in its entirety.

TECHNICAL FIELD

The present disclosure relates to light detection and ranging (lidar) systems and, more particularly, to a lidar receiver with dual analog-to-digital converters (ADCs).

BACKGROUND

A measurement system may be used for depth-sensing measurements. For example, a lidar system may transmit pulses of laser light, and may measure reflected pulses to determine a distance of an object from the lidar system. In this case, the lidar system may perform a time-of-flight measurement of the laser pulse and may generate a three-dimensional representation of an object. A frequency-modulated continuous-wave (FMCW) lidar system may transmit continuous laser light according to a prescribed, continuous variation in frequency. In this case, the FMCW lidar system may determine a frequency difference between a received signal and a transmitted signal to generate a three-dimensional representation of an object.

SUMMARY

According to some implementations, a lidar receiver may include: a first frequency filter to pass a first range of frequencies of an analog signal; a second frequency filter to pass a second range of frequencies of the analog signal that is different from the first range of frequencies of the analog signal; a first ADC to derive a first digital signal based on the first range of frequencies of the analog signal using a first sampling rate; and a second ADC to derive a second digital signal based on the second range of frequencies of the analog signal using a second sampling rate that is different from the first sampling rate.

According to some implementations, a lidar system may include a transmitter to transmit an optical beam, and a receiver to receive a reflection of the optical beam, the receiver including: a first frequency filter to pass a first range of frequencies of an analog signal that is based at least in part on the reflection; a second frequency filter to pass a second range of frequencies of the analog signal that is different from the first range of frequencies of the analog signal; a first ADC to derive a first digital signal based on the first range of frequencies of the analog signal using a first sampling rate; and a second ADC to derive a second digital signal based on the second range of frequencies of the analog signal using a second sampling rate that is different from the first sampling rate.

According to some implementations, a method may include filtering, by a lidar system, an analog signal to a first range of frequencies of the analog signal; filtering, by the lidar system, the analog signal to a second range of frequencies of the analog signal; converting, by the lidar system and using a first sampling rate, the first range of frequencies of the analog signal to a first digital signal; converting, by the lidar system and using a second sampling rate that is different from the first sampling rate, the second range of frequencies of the analog signal to a second digital signal; generating, by the lidar system and based on the first digital signal, a first digital representation associated with a first distance range; and generating, by the lidar system and based on the second digital signal, a second digital representation associated with a second distance range.

DETAILED DESCRIPTION

The following detailed description of example implementations refers to the accompanying drawings. The same reference numbers in different drawings may identify the same or similar elements.

A lidar system may determine digital representations of targets within a particular distance range of the lidar system. To obtain a digital representation, the lidar system may sample an analog signal (e.g., based on a received signal reflected by a target) at a particular sampling rate to derive a digital signal. In some instances, the particular sampling rate used may result in digital representations of far targets at an acceptable resolution, but result in digital representations of near targets at an unacceptable resolution. The resolution of near targets may be unacceptable because a computer system, such as an autonomous vehicle system, associated with the lidar system may require higher resolution of near targets for proper identification, avoidance, and/or the like. However, due to limitations associated with processing power, heat generation, and/or the like, it may not be possible to increase the sampling rate that is used.

According to some implementations described herein, a receiver of a lidar system may include dual ADCs that operate at different sampling rates to improve the resolution of digital representations of near targets. In some implementations, the receiver may also include dual frequency filters that provide respective frequency ranges of a signal to the dual ADCs. For example, a first frequency filter may pass a frequency range of a signal to a higher sampling rate ADC, and a second frequency filter may pass a subset of the frequency range of the signal to a lower sampling rate ADC. In this way, the dual ADCs may generate respective digital signals, which the lidar system may use to generate a first digital representation associated with the frequency range at a first lower resolution and a second digital representation associated with the subset of the frequency range at a second higher resolution. Accordingly, the lidar system provides high resolution representations of near targets as well as representations of far targets with reduced processing.

Figure 1:
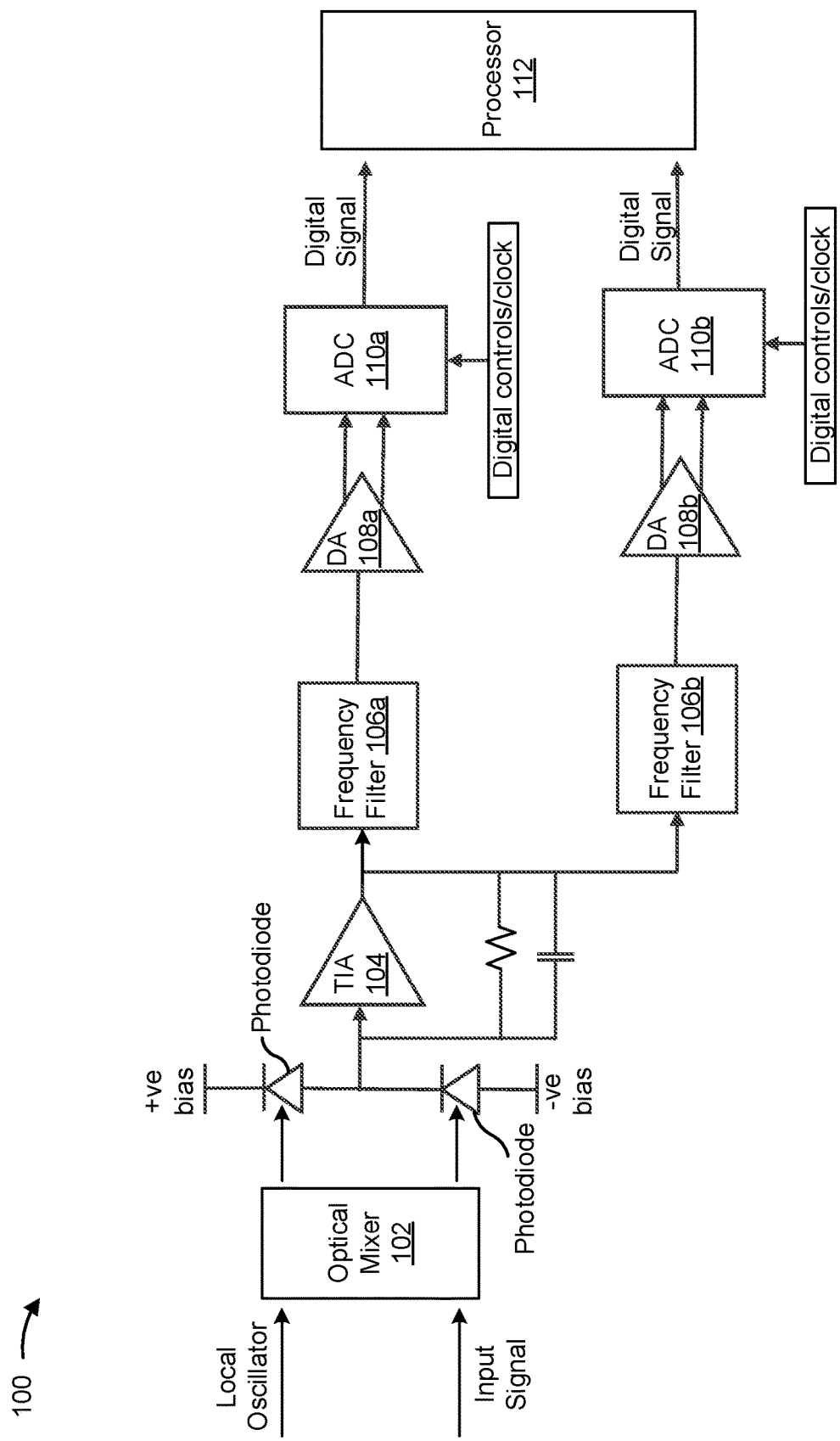
FIG. 1 is a diagram of an example receiver for a lidar system described herein.

FIG. 1 is a diagram of an example receiver 100 for a lidar system described herein. In particular, FIG. 1 shows a circuit associated with the receiver 100. In some implementations, the lidar system (or another three-dimensional sensing system) may include the receiver 100, a transmitter, and one or more processors. The transmitter may be configured to transmit an optical beam (e.g., a laser beam), and the receiver 100 may be configured to generate, using the one or more processors, a digital representation based on a reflection of the optical beam off of one or more targets. In some implementations, the lidar system may be a coherent lidar system, such as an FMCW lidar system. In some implementations, the lidar system (e.g., FMCW lidar system) may be associated with an autonomous machine, such as an autonomous vehicle.

As shown in FIG. 1, an optical mixer 102 may receive an input signal associated with a reflection of an optical beam transmitted by the transmitter of the lidar system. In some implementations, such as in FMCW lidar, the optical mixer 102 also may receive a signal associated with a local oscillator of the lidar system. The optical mixer 102 may output a signal associated with a difference (e.g., a heterodyne measurement) of the input signal and the signal associated with the local oscillator to one or more photodiodes, and the one or more photodiodes may generate a photocurrent based on the signal associated with the difference.

The photocurrent may be directed to a transimpedance amplifier (TIA) 104 that is configured to output an analog signal (e.g., a voltage) based on the photocurrent. As shown in FIG. 1, the TIA 104 may output the analog signal to a first frequency filter 106*a* and a second frequency filter 106*b*. That is, the first frequency filter 106*a* and the second frequency filter 106*b* may receive (e.g., concurrently) the analog signal from the same TIA 104.

The frequency filters 106 may be configured to pass (e.g., concurrently) a particular range of frequencies of the received analog signal. For example, the frequency filters 106 may be band-pass filters, low-pass filters, and/or the like. In some implementations, the first frequency filter 106*a* may be one type of frequency filter and the second frequency filter 106*b* may be another type of frequency filter.

In some implementations, the first frequency filter 106*a* may be configured to pass a first range of frequencies, and the second frequency filter 106*b* may be configured to pass a second range of frequencies. The first range of frequencies may be different from the second range of frequencies. For example, the first range of frequencies may be greater than the second range of frequencies (e.g., the first range of frequencies may include more frequencies than the second range of frequencies). As an example, the first range of frequencies may be at least four-times, at least five-times, at least six-times, at least seven-times, at least eight-times, at least nine-times, or at least ten-times the second range of frequencies (e.g., the first range of frequencies may include at least four-times, at least five-times, at least six-times, at least seven-times, at least eight-times, at least nine-times, or at least ten-times as many frequencies as the second range of frequencies).

In some implementations, the first range of frequencies may have a highest frequency that is higher than a highest frequency of the second range of frequencies. Moreover, the first range of frequencies may include the second range of frequencies. That is, the second range of frequencies may be a subset of the first range of frequencies. For example, the first range of frequencies may be 1-1000 megahertz (MHz), 1-750 MHz, 1-500 MHz, or 1-400 MHz and the second range of frequencies may be 1-125 MHz, 1-100 MHz, 1-75 MHz, or 1-50 MHz.

In such examples, a higher frequency may correspond to a target that is further away from the receiver 100. For example, a frequency range of 1-500 MHz may be associated with targets that are within a distance of 1-250 meters (m) from the receiver 100, and a frequency range of 1-100 MHz may be associated with targets that are within a distance of 1-50 m of the receiver 100. Accordingly, the first range of frequencies may be associated with a first distance range from the receiver 100, and the second range of frequencies may be associated with a second distance range from the receiver 100 that is smaller than the first distance range. For example, the first distance range may be at least four-times, at least five-times, at least six-times, at least seven-times, at least eight-times, at least nine-times, or at least ten-times the second distance range. Reducing the frequency range, and therefore distance range, passed by the second frequency filter 106*b* relative to the first frequency filter 106*a* facilitates generation of a high resolution digital representation using reduced sampling, thereby conserving processing resources of the lidar system.

The first frequency filter 106*a* may provide an output of the first frequency range of the analog signal to a first differential amplifier ADC driver (DA) 108*a* associated with a first ADC 110*a*, and the second frequency filter 106*b* may provide an output of the second frequency range of the analog signal to a second DA 108*b* associated with a second ADC 110*b*. The DAs 108 may be used to improve the analog signal prior to processing by the ADCs 110. In some implementations, the first DA 108*a* may operate at a higher speed suitable for driving the first ADC 110*a*, and the second DA 108*b* may operate at a lower speed suitable for driving the second ADC 110*b*.

Accordingly, the first ADC 110*a* may receive the first frequency range of the analog signal from the frequency filter 106*a* via the first DA 108*a*, and the second ADC 110*b* may receive the second frequency range of the analog signal from the second frequency filter 106*b* via the second DA 108*b*. The ADCs 110 may be configured to convert (e.g., concurrently) the respective analog signals to respective digital signals for use by one or more processors 112. For example, the first ADC 110*a* may sample from the first frequency range of the analog signal to derive a first digital signal, and the second ADC 110*b* may sample from the second frequency range of the analog signal to derive a second digital signal. In some implementations, the first ADC 110*a* and the second ADC 110*b* may sample from rising portions and/or falling portions of the analog signal, as described below in connection with FIG. 2.

In some implementations, the first ADC 110*a* may use a first sampling rate, and the second ADC 110*b* may use a second sampling rate. The first sampling rate may be different from the second sampling rate. For example, the first sampling rate may be greater than the second sampling rate. As an example, the first sampling rate may be at least four-times, at least five-times, at least six-times, at least seven-times, at least eight-times, at least nine-times, or at least ten-times the second sampling rate. In some implementations, the first sampling rate may be at least 500 mega-samples (Ms)/second (s), at least 750 Ms/s, or at least 1000 Ms/s, and the second sampling rate may be at most 100 Ms/s, at most 150 Ms/s, at most 200 Ms/s, or at most 250 Ms/s. In some implementations, the first ADC 110*a* may sample at a first sampling interval of at most 2 nanoseconds (ns), at most 1.5 ns, or at most 1 ns, and the second ADC 110*b* may sample at a second sampling interval of at least 4 ns, at least 5 ns, or at least 6 ns.

In some implementations, the first sampling rate and the second sampling rate may satisfy a Nyquist rate. In other words, the first sampling rate may be a value that is at least two-times a highest frequency of the first frequency range, and the second sampling rate may be a value that is at least two-times a highest frequency of the second frequency range. For example, if the first frequency range is 1-100 MHz, the first sampling rate may be at least 200 Ms/s.

The first ADC 110a may output a first digital signal (e.g., derived from sampling the first range of frequencies of the analog signal) to the processor 112, and the second ADC 110b may output a second digital signal (e.g., derived from sampling the second range of frequencies of the analog signal) to the processor 112. The processor 112 may generate (e.g., concurrently) a first digital representation of one or more targets (e.g., in a field-of-view (FOV) of the lidar system) based on the first digital signal and a second digital representation of one or more targets (e.g., in the FOV of the lidar system) based on the second digital signal. For example, the processor 112 may process the first digital signal with a fast Fourier transform (FFT) in order to generate the first digital representation, and may process the second digital signal with the FFT to generate the second digital representation.

The first digital representation may be associated with a first resolution, and the second digital representation may be associated with a second resolution. The second resolution may be higher than the first resolution. The first resolution or the second resolution may be a range resolution, a radial velocity resolution, and/or the like. In some implementations, the first resolution may be a radial velocity resolution or a range resolution and the second resolution may be a range resolution. In some implementations, the first resolution (e.g., range resolution) may be at least 5 centimeters (cm), at least 8 cm, or at least 10 cm, and the second resolution (e.g., range resolution) may be at most 5 cm, at most 4 cm, or at most 3 cm.

The first digital representation may be associated with a first distance range from the receiver 100, and the second digital representation may be associated with a second distance range from the receiver 100. The first distance range may be greater than the second distance range. For example, the first distance range may be at least four-times, at least five-times, at least six-times, at least seven-times, at least eight-times, at least nine-times, or at least ten-times the second distance range. As an example, the first distance range may be 1-250 m and the second distance range may be 1-50 m.

In this way, the receiver 100 may facilitate concurrent lidar functionality at different distance ranges and/or resolutions while minimizing consumption of processing resources and without increasing processing times. Moreover, the first frequency filter 106a and the first ADC 110a may be configured to facilitate lidar functionality that maximizes range, and the second frequency filter 106b and the second ADC 110b may be configured to facilitate lidar functionality that maximizes resolution. Furthermore, the reduced frequency range passed by the second frequency filter 106b relative to the first frequency filter 106a reduces electromagnetic interference in the analog signal passed by the second frequency filter 106b, thereby further improving the resolution of the second digital representation. In addition, the second ADC 110b may facilitate lidar functionality at near range in the event that the first ADC 110a fails (e.g., due to higher processing demands, overheating, and/or the like), thereby improving autonomous machines, such as autonomous vehicles, that may rely on near range sensing for identifying targets, avoiding targets, and/or the like.

As indicated above, FIG. 1 is provided merely as an example. Other examples may differ from what is described with regard to FIG. 1.

Figure 2:
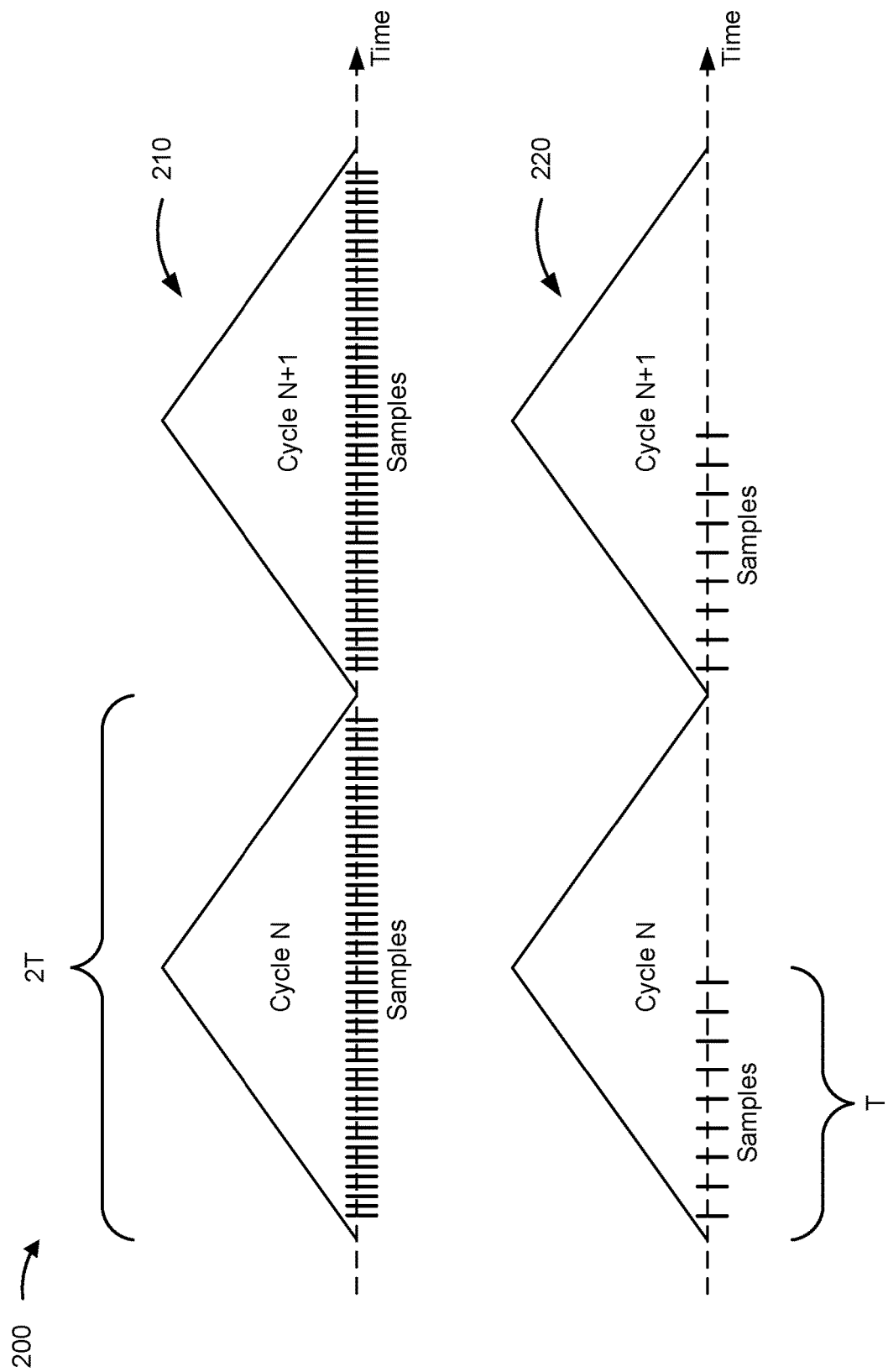
FIG. 2 is a diagram of an example implementation described herein.

FIG. 2 is a diagram of an example implementation 200 described herein. In particular, FIG. 2 shows an example 210 of sampling an analog signal (e.g., a chirp) at a first greater sampling rate, and an example 220 of sampling an analog signal at a second lesser sampling rate. For example, the first ADC 110a may perform the sampling of example 210 and the second ADC 110b may perform the sampling of example 220.

As shown in FIG. 2, and by example 210, the first ADC 110a may sample the analog signal (e.g., the first range of frequencies of the analog signal) using a first sampling rate (e.g., 1000 Ms/s), as described above. In some implementations, the first ADC 110a may sample from a first cycle (Cycle N) of the analog signal to derive a first digital signal for processing with the FFT, and may sample from a second cycle (Cycle N+1) of the analog signal to derive a second digital signal for processing with the FFT. In addition, the first ADC 110a may sample (e.g., in a Hanning window) both a rising portion (e.g., a rising edge, such as of a cycle of a chirp) and a falling portion (e.g., a falling edge, such as of a cycle of a chirp) of a cycle of the analog signal (e.g., occurring over time 2T, such as at most 10 microseconds). In this way, the digital signal produced by the first ADC 110a may include target finding data as well as velocity data (e.g., Doppler data).

As shown by example 220, the second ADC 110b may sample the analog signal (e.g., the second range of frequencies of the analog signal) using a second sampling rate (e.g., 250 Ms/s), as described above. In some implementations, the second ADC 110b may sample (e.g., in a Hanning window) from rising portions (and not falling portions) of consecutive cycles (Cycle N and Cycle N+1 as shown, however more than two consecutive cycles may be used) of the analog signal to derive a digital signal for processing with the FFT. Alternatively, the second ADC 110b may sample (e.g., in a Hanning window) from falling portions (and not rising portions) of consecutive cycles of the analog signal to derive a digital signal for processing with the FFT. As shown in FIG. 2, a rising portion or a falling portion of a cycle (e.g., Cycle N) may occur over an integration time T. Accordingly, the second ADC 110b may utilize a longer integration time (e.g., 10 microseconds) for sampling than the first ADC 110a (e.g., which may utilize an integration time of 5 microseconds). In this way, the resolution of a resulting digital representation may be improved while using less samples (e.g., relative to a digital representation resulting from an output of the first ADC 110a, which uses a shorter integration time and more samples), thereby conserving processing resources.

In some implementations, the second ADC 110b and/or the processor 112 may combine (e.g., concatenate) first samples taken from a rising portion, or a falling portion, of a first cycle (Cycle N) and second samples taken from a respective rising portion, or a respective falling portion, of a second cycle (Cycle N+1) for processing with the FFT. In this way, the digital signal produced by the second ADC 110b may include target finding data and may omit velocity data (which may be included in the digital signal produced by the first ADC 110a, as described above), thereby facilitating reduced processing. Moreover, combining samples from consecutive cycles results in a digital representation having improved resolution relative to a digital representation using samples from a single cycle.

In some implementations, the second ADC 110b may sample from a rising portion and a falling portion of a single cycle (e.g., Cycle N) for processing with the FFT (e.g., when Doppler data is desired). In such a case, the processor 112 may utilize Doppler data from the first ADC 110a and the second ADC 110b to improve target speed detection. In some implementations, the second ADC 110b may sample from a rising portion or a falling portion of a single cycle (e.g., Cycle N) for processing with the FFT (e.g., when further reductions in processing are desired).

As indicated above, FIG. 2 is provided merely as an example. Other examples may differ from what is described with regard to FIG. 2.

Figure 3:
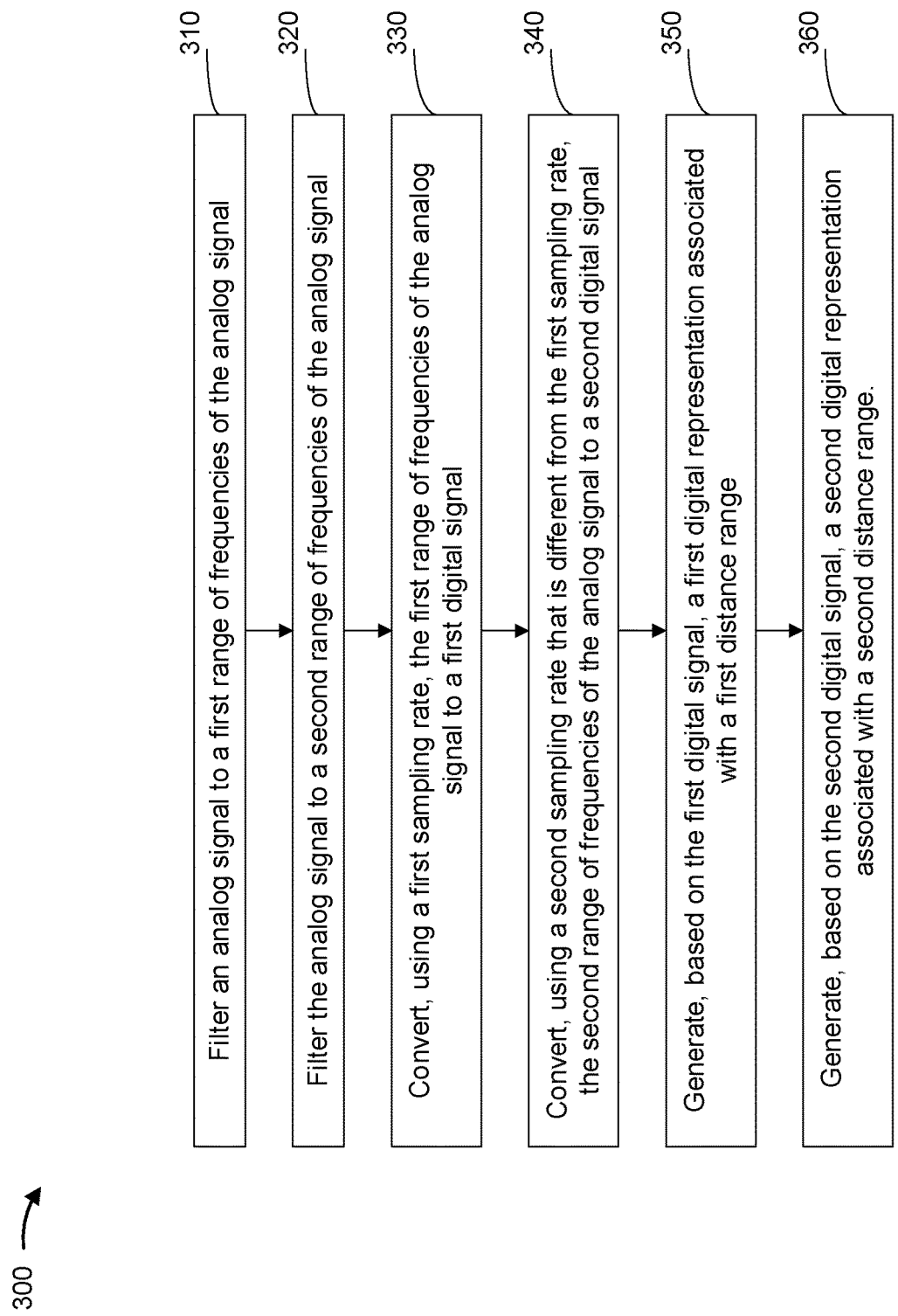
FIG. 3 is a flowchart of an example process for lidar detection.

FIG. 3 is a flow chart of an example process 300 for lidar detection. In some implementations, one or more process blocks of FIG. 3 may be performed by a lidar system (e.g., a lidar system including receiver 100). In some implementations, one or more process blocks of FIG. 3 may be performed by another device or a group of devices separate from or including the lidar system.

As shown in FIG. 3, process 300 may include filtering an analog signal to a first range of frequencies of the analog signal (block 310). For example, the lidar system (e.g., using a frequency filter 106, and/or the like) may filter an analog signal to a first range of frequencies of the analog signal, as described above.

As further shown in FIG. 3, process 300 may include filtering the analog signal to a second range of frequencies of the analog signal (block 320). For example, the lidar system (e.g., using a frequency filter 106, and/or the like) may filter the analog signal to a second range of frequencies of the analog signal, as described above.

As further shown in FIG. 3, process 300 may include converting, using a first sampling rate, the first range of frequencies of the analog signal to a first digital signal (block 330). For example, the lidar system (e.g., using an ADC 110, and/or the like) may convert, using a first sampling rate, the first range of frequencies of the analog signal to a first digital signal, as described above.

As further shown in FIG. 3, process 300 may include converting, using a second sampling rate that is different from the first sampling rate, the second range of frequencies of the analog signal to a second digital signal (block 340). For example, the lidar system (e.g., using an ADC 110, and/or the like) may convert, using a second sampling rate that is different from the first sampling rate, the second range of frequencies of the analog signal to a second digital signal, as described above.

As further shown in FIG. 3, process 300 may include generating, based on the first digital signal, a first digital representation associated with a first distance range (block 350). For example, the lidar system (e.g., using processor 112, a memory, and/or the like) may generate, based on the first digital signal, a first digital representation associated with a first distance range, as described above.

As further shown in FIG. 3, process 300 may include generating, based on the second digital signal, a second digital representation associated with a second distance range (block 360). For example, the lidar system (e.g., using processor 112, a memory, and/or the like) may generate, based on the second digital signal, a second digital representation associated with a second distance range, as described above.

Process 300 may include additional implementations, such as any single implementation or any combination of implementations described below and/or in connection with one or more other processes described elsewhere herein.

In a first implementation, the first range of frequencies of the analog signal includes more frequencies than the second range of frequencies of the analog signal, and the first sampling rate is greater than the second sampling rate.

In a second implementation, alone or in combination with the first implementation, the analog signal is filtered to the first range of frequencies of the analog signal using a first frequency filter, and the analog signal is filtered to the second range of frequencies of the analog signal using a second frequency filter. In a third implementation, alone or in combination with one or more of the first and second implementations, the first range of frequencies of the analog signal is converted to the first digital signal using a first ADC, and the second range of frequencies of the analog signal is converted to the second digital signal using a second ADC.

In a fourth implementation, alone or in combination with one or more of the first through third implementations, the second digital signal is based on samples from rising portions of consecutive cycles of the second range of frequencies of the analog signal or falling portions of consecutive cycles of the second range of frequencies of the analog signal.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

In some implementations, the circuits, devices, and/or components described herein may be used for three-dimensional sensing applications.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A light detection and ranging (lidar) receiver, comprising:

a first frequency filter to pass a first range of frequencies of an analog signal;
a second frequency filter to pass a second range of frequencies of the analog signal that is different from the first range of frequencies of the analog signal;
a first analog-to-digital converter (ADC) to derive a first digital signal based on the first range of frequencies of the analog signal using a first sampling rate,
wherein the first digital signal is to be used to generate a first digital representation at a first resolution; and
a second ADC to derive a second digital signal based on the second range of frequencies of the analog signal using a second sampling rate that is different from the first sampling rate,
wherein the second digital signal is to be used to generate a second digital representation at a second resolution that is different than the first resolution.

2. The lidar receiver of claim 1, wherein the first frequency filter and the second frequency filter are to receive the analog signal from a same transimpedance amplifier.

3. The lidar receiver of claim 1, wherein the first range of frequencies of the analog signal includes more frequencies than the second range of frequencies of the analog signal.

4. The lidar receiver of claim 1, wherein the first range of frequencies of the analog signal includes at least four times as many frequencies as the second range of frequencies of the analog signal.

5. The lidar receiver of claim 1, wherein the first sampling rate is greater than the second sampling rate.

6. The lidar receiver of claim 1, wherein the first sampling rate is at least four times the second sampling rate.

7. The lidar receiver of claim 1, wherein the first range of frequencies of the analog signal is associated with a first distance range from the lidar receiver, and the second range of frequencies of the analog signal is associated with a second distance range from the lidar receiver that is smaller than the first distance range.

8. A light detection and ranging (lidar) system, comprising:
a transmitter to transmit an optical beam; and
a receiver to receive a reflection of the optical beam, the receiver comprising:
a first frequency filter to pass a first range of frequencies of an analog signal that is based at least in part on the reflection;
a second frequency filter to pass a second range of frequencies of the analog signal that is different from the first range of frequencies of the analog signal;
a first analog-to-digital converter (ADC) to derive a first digital signal based on the first range of frequencies of the analog signal using a first sampling rate,
wherein the first digital signal is to be used to generate a first digital representation that is associated with one or more of:
a first resolution, or
a first distance range; and
a second ADC to derive a second digital signal based on the second range of frequencies of the analog signal using a second sampling rate that is different from the first sampling rate,
wherein the second digital signal is to be used to generate a second digital representation that is associated with one or more of:
a second resolution that is different than the first resolution, or
a second distance range that is different than the first distance range.

9. The lidar system of claim 8, wherein the first frequency filter and the second frequency filter are to receive the analog signal from a same transimpedance amplifier.

10. The lidar system of claim 8, wherein the first range of frequencies of the analog signal includes more frequencies than the second range of frequencies of the analog signal.

11. The lidar system of claim 8, wherein a highest frequency of the first range of frequencies of the analog signal is higher than a highest frequency of the second range of frequencies of the analog signal.

12. The lidar system of claim 8, wherein the first range of frequencies of the analog signal includes the second range of frequencies of the analog signal.

13. The lidar system of claim 8, wherein the first sampling rate is greater than the second sampling rate.

14. The lidar system of claim 8, wherein the first digital representation has the first resolution, and the second digital representation has the second resolution.

15. A method, comprising:
filtering, by a light detection and ranging (lidar) system, an analog signal to a first range of frequencies of the analog signal;
filtering, by the lidar system, the analog signal to a second range of frequencies of the analog signal;
converting, by the lidar system and using a first sampling rate, the first range of frequencies of the analog signal to a first digital signal;
converting, by the lidar system and using a second sampling rate that is different from the first sampling rate, the second range of frequencies of the analog signal to a second digital signal;
generating, by the lidar system and based on the first digital signal, a first digital representation associated with a first distance range; and
generating, by the lidar system and based on the second digital signal, a second digital representation associated with a second distance range.

16. The method of claim 15, wherein the first range of frequencies of the analog signal includes more frequencies than the second range of frequencies of the analog signal, and
wherein the first sampling rate is greater than the second sampling rate.

17. The method of claim 15, wherein the analog signal is filtered to the first range of frequencies of the analog signal using a first frequency filter, and the analog signal is filtered to the second range of frequencies of the analog signal using a second frequency filter.

18. The method of claim 15, wherein the first range of frequencies of the analog signal is converted to the first digital signal using a first analog-to-digital converter (ADC), and the second range of frequencies of the analog signal is converted to the second digital signal using a second ADC.

19. The method of claim 15, wherein the second digital signal is based on samples from rising portions of consecutive cycles of the second range of frequencies of the analog signal or falling portions of consecutive cycles of the second range of frequencies of the analog signal.

20. The lidar receiver of claim 1, wherein the first digital representation is associated with a first distance range, and the second digital representation is associated with a second distance range.

* * * * *